United States Patent
Uematsu et al.

[11] Patent Number: 5,847,453
[45] Date of Patent: Dec. 8, 1998

[54] MICROWAVE CIRCUIT PACKAGE

[75] Inventors: Hiroshi Uematsu; Hiroshi Kudoh; Masanobu Urabe, all of Wako, Japan

[73] Assignee: Honda Giken Kogyo Kabushiki Kaisha, Tokyo, Japan

[21] Appl. No.: 820,817

[22] Filed: Mar. 19, 1997

[30] Foreign Application Priority Data

Mar. 27, 1996 [JP] Japan .................................. 8-072968
Apr. 30, 1996 [JP] Japan .................................. 8-109617

[51] Int. Cl.⁶ ............................. H01L 23/34; H01L 29/40
[52] U.S. Cl. ........................... 257/728; 257/64; 257/725; 333/247
[58] Field of Search ................................ 257/664, 725, 257/728; 333/247

[56] References Cited

U.S. PATENT DOCUMENTS 5,422,513 6/1995 Marcinkiewicz et al. ............... 257/668
5,559,363 9/1996 Immorlica, Jr. ......................... 257/664

FOREIGN PATENT DOCUMENTS 2-250983 9/1990 Japan .
4-213863 8/1992 Japan .................................... 257/728

*Primary Examiner*—Teresa M. Arroyo
*Attorney, Agent, or Firm*—Lyon & Lyon LLP

[57] ABSTRACT

A microwave circuit package includes a metallic base plate on which are mounted a plurality of monolithic microwave integrated circuits (MMICs) and a spacer, made of a dielectric material, separating the MMICs from each other, and the MMICs and spacer are sealed in the package. The provision of the spacer substantially reduces the volume of the interior space of the package. A dielectric substrate having generally the same height as substrates of the MMICs may also be mounted on the metallic base plate, and a strip conductor may be provided on the dielectric substrate so as to form a microstrip line thereon.

12 Claims, 8 Drawing Sheets

MICROWAVE CIRCUIT PACKAGE

BACKGROUND OF THE INVENTION

1. Field of the Invention

The present invention relates to an improved microwave circuit package which seals therein microwave circuitry having monolithic microwave integrated circuits (hereinafter referred to as MMICs) and which is suitable for fabrication of an integrated circuit device.

2. Description of the Related Art

Generally, in microwave circuitry using an MMIC element such as GaAs FETs (field-effect transistors), the MMIC element is connected to a driver circuit, as typically disclosed in Japanese Patent Laid-open Publication No. HEI-4-129402.

The MMIC element, in the form of a semiconductor chip, must be kept in a hermetically sealed condition and hence is connected to the driver circuit in such a manner as shown in FIG. 11. Namely, the chips of the MMIC element 51 and driver circuit 52 are formed on a ceramic circuit board 53, which is in turn mounted on a base plate 54 made of a metal material such as kovar. The driver circuit 52 is a hybrid circuit of various elements 52a such as a resistor, condenser chip and transistor chip. As shown, the driver circuit 52 has one end connected via a bonding wire 57 to a biasing direct current (DC) terminal 58 that extends through the metallic base plate 54 in an insulated condition.

One end of the MMIC element 51 mounted on the metallic base plate 54 is connected via a bonding wire 59 to a high-frequency (RF) terminal 60 that extends through the metallic base plate 54 in an insulated condition. The output of the drive circuit 52 and MMIC element 51 are interconnected via a bonding wire 61, so that DC power supplied via the DC terminal 58 is transformed via the driver circuit 52 into a predetermined biasing voltage that is then applied to the MMIC element 51. High-frequency output from the MMIC element 51 is led outside by way of the bonding wire 59 and RF terminal 60. Reference numerals 58a and 60a represent insulators.

An upper lid 56 is attached to the metallic base plate 54 via a ceramic package frame 55, in order to enclose a space where the above-mentioned and other components are provided. In the above-mentioned manner, a box-shaped microwave circuit package 50 is constructed.

Although the MMIC element 51 and driver circuit 52 are both mounted in generally the same plane on the metallic base plate 54, it is desirable to mount a plurality of MMIC chips each having a plurality of the MMIC elements integrated thereon, in order to reduce the entire package size and provide higher integration.

However, if the metallic base plate 54 has a wider area, the volume of interior space of the box-shaped package tends to become greater, which would undesirably result in increased floating capacity. Thus, in the microwave band of 1 GHz–100 GHz, resonant characteristics of the package are liable to change to thereby cause unwanted abnormal resonance, with the result that electromagnetic waves of unnecessary frequencies are produced which would prevent the microwave circuit from performing its desired functions. For these reasons, it is highly desirable that the volume of the interior space of the package be optimized to permit optimal performance of the MMICs.

SUMMARY OF THE INVENTION

In a microwave circuit package according to the present invention, a plurality of MMICs and a spacer for separating the MMICs from each other are mounted together on a single metallic base plate and sealed in the package. Specifically, the number of the MMICs is two or more, and the number of the spacer is one or more. By the provision of such a spacer separating the MMICs from each other, the volume of the interior space of the package can be optimized to effectively prevent abnormal resonance, electromagnetic waves of unnecessary frequencies, etc. Particularly, by positioning the MMICs symmetrically about the spacer, the MMICs can be packaged with a same resonance system. As a result, the MMICs can operate with same characteristics, which achieves increased reliability of the microwave circuit.

The microwave circuit package may further include a frame mounted on the periphery of the metallic base plate and an upper lid mounted on the top of the frame so that the MMICs are sealed in the package by the frame and upper lid. The spacer is greater in height than the MMICs and is made of a same material as the frame. Such a spacer affords the same effects as if the MMICs were separated from each other by the frame, and the MMICs can be packaged with a same resonance system.

Further, the microwave circuit package of the invention includes a dielectric substrate having substantially the same height as substrates of the MMICs and mounted on the metallic base plate, and the MMICs and dielectric substrate are sealed in the package. A strip conductor is provided on the dielectric substrate so as to form a microstrip line thereon. Namely, the strip conductor and the circuit surface of the MMICs are positioned in substantially the same planes so that abnormal resonance and electromagnetic waves of unnecessary frequencies can be more effectively prevented than where the strip conductor and the circuit surface of the MMICs are not at the same height.

Furthermore, in the microwave circuit package according to another aspect of the invention, there are mounted, on a single metallic base plate, a plurality of MMICs and a dielectric substrate having substantially the same height as substrates of the MMICs so as to separate the MMICs from each other. Similarly to the above-mentioned, a strip conductor is provided on the dielectric substrate so as to form a microstrip line thereon. The microstrip line forms a circuit element such as a capacitance circuit element or inductance circuit element. Namely, the strip conductor is provided at substantially the same height as the substrates of the MMICs, and thus the circuit element formed by the strip conductor and the circuit surfaces of the MMICs are positioned in generally the same plane within the package.

Further, according to the present invention, the microstrip line and MMICs are interconnected via beam leads. As a result, the microstrip line and MMICs can be interconnected with increased strength and with less inductance, which achieves enhanced operational characteristics of the microwave circuit in high-frequency ranges.

BRIEF DESCRIPTION OF THE DRAWINGS

For better understanding of the present invention, various preferred embodiments will be described hereinbelow with reference to the accompanying drawings, in which:

FIGS. 10A and 10B are diagrams illustrating examples of circuit elements formed of microstrip lines, of which FIG. 10A shows a capacitance circuit element and FIG. 10B shows an inductance circuit element.

DETAILED DESCRIPTION OF THE PREFERRED EMBODIMENTS

Figure 1:
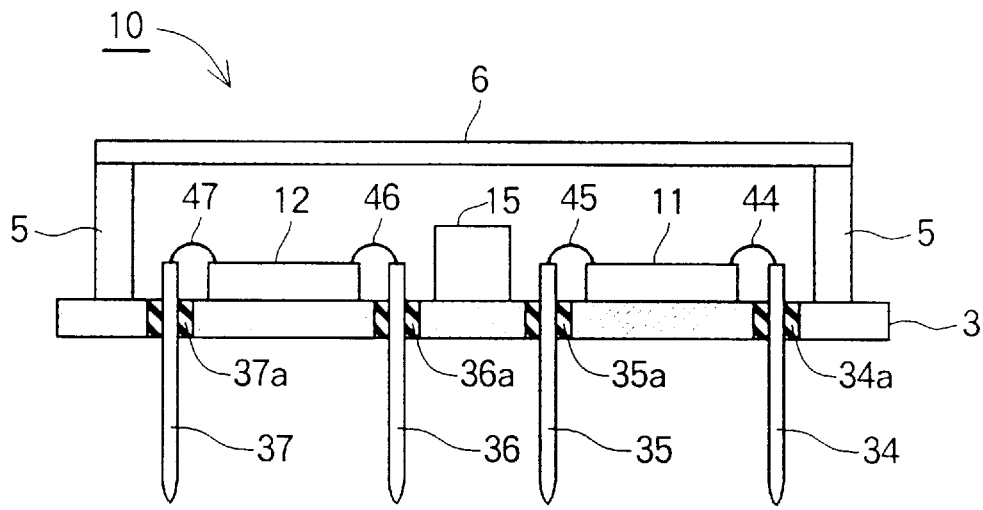
FIG. 1 is a schematic sectional view of a microwave circuit package according to a first embodiment of the present invention.
Figure 2:
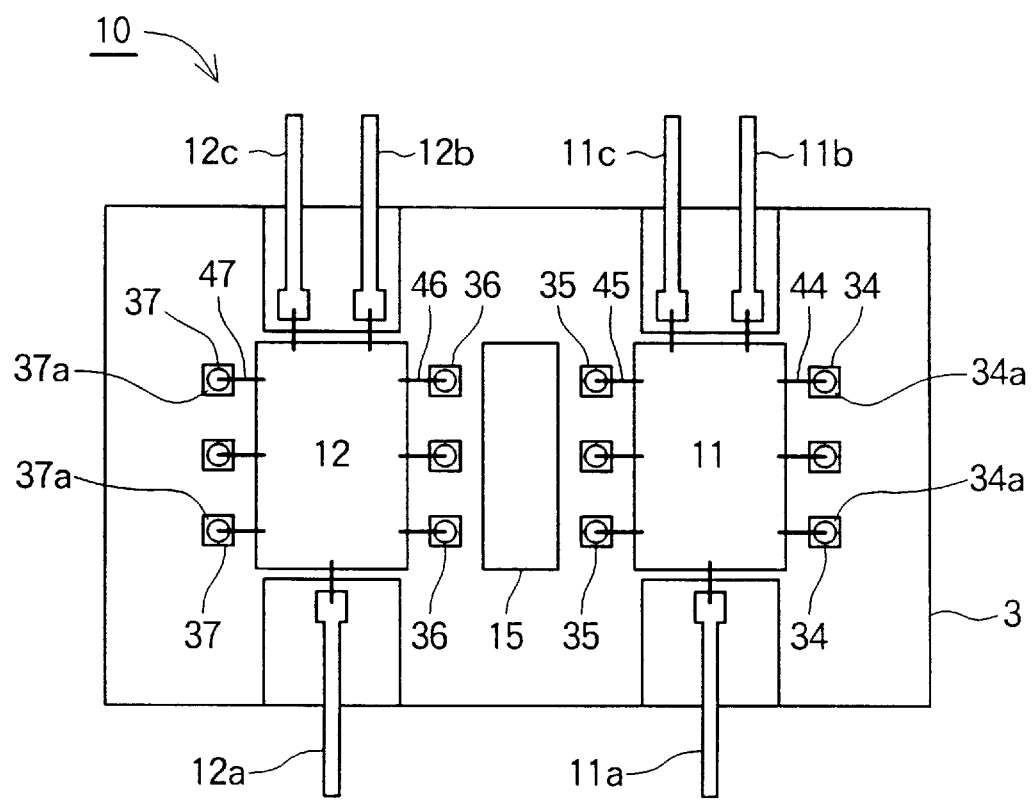
FIG. 2 is a schematic plan view of the microwave circuit package of FIG. 1, with its frame and upper lid removed.

FIGS. 1 and 2 show a microwave circuit package 10 according to a first embodiment of the present invention. This microwave circuit package 10 includes a base plate 3 made of a metal material, such as kovar, on which are mounted two MMICs (Monolithic Microwave Integrated Circuits) 11 and 12. The package 10 also includes a ceramic package frame 5 fixedly mounted on the base plate 3 and an upper lid 6 (made of a dielectric material, for example) secured to the top surface of the frame 5, so as to seal the MMICs 11 and 12 within the package 10. A spacer 15 made of a dielectric material is also mounted on the base plate 3 to separate the MMICs 11 and 12 from each other.

As seen from FIGS. 1 and 2, three pairs of biasing DC terminals 34 and 35 for supplying predetermined biasing voltage extend through the metallic base plate 3 with respective insulators 34a and 35a interposed therebetween and are connected via bonding wires 44 and 45 to a power supply terminal of the first MMIC 11. Similarly, three pairs of biasing DC terminals 36 and 37 for supplying predetermined biasing voltage extend through the metallic base plate 3 with respective insulators 36a and 37a interposed therebetween and are connected via bonding wires 46 and 47 to a power supply terminal of the second MMIC 12.

According to the first embodiment, the volume of the interior space of the microwave circuit package 10 is reduced by the provision of the spacer separating the MMICs 11 and 12 from each other. In the illustrated example, the MMICs 11 and 12 and DC terminals 34, 35 and 36, 37 are provided substantially symmetrically about the spacer 15.

As shown in FIG. 2, the first MMIC 11 has a high-frequency input connected via a bonding wire to a RF terminal 11a and two high-frequency outputs connected via bonding wires to RF terminals 11b and 11c, respectively. Similarly, the second MMIC 12 has a high-frequency input connected via a bonding wire to a RF terminal 12a and two high-frequency outputs connected via bonding wires to RF terminals 12b and 12c, respectively.

The DC terminals 34 to 37 each extend perpendicularly to the general plane of the metallic base plate 3 as best seen in FIG. 1, and the RF terminals 11a–11c, 12a–12c are provided on opposite sides (upper and lower sides in the example of FIG. 2) and extend along the surface of the metallic base plate 3. This achieves adjoining and high-density arrangement of the various components of the microwave circuit package 10.

Figure 3:
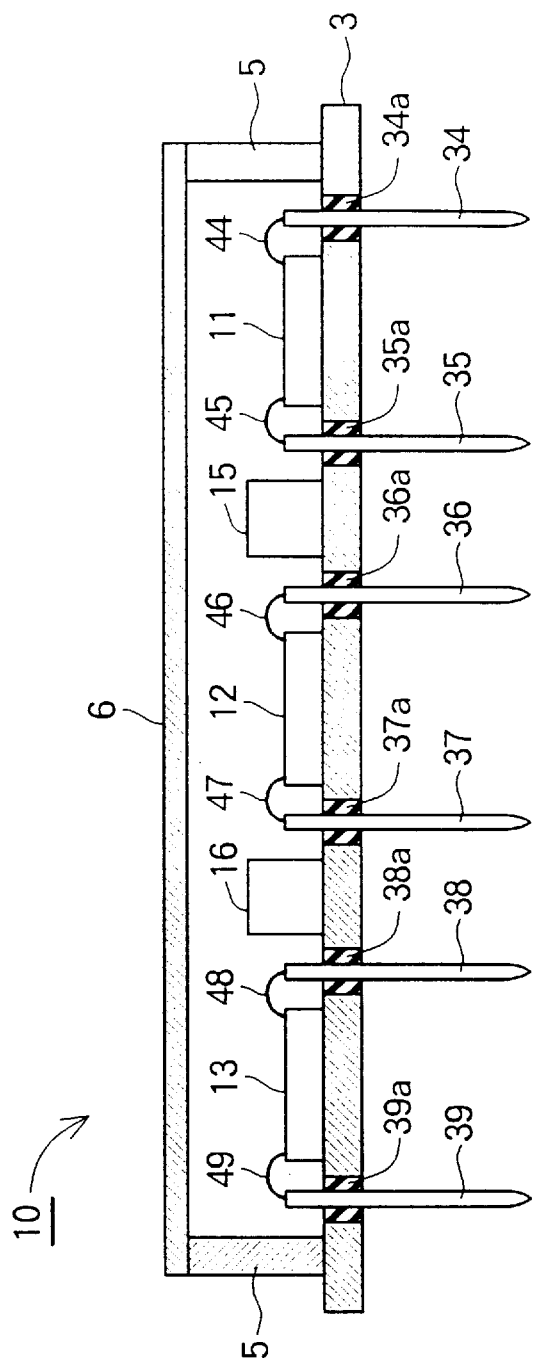
FIG. 3 is a schematic sectional view of a microwave circuit package according to a second embodiment of the present invention.
Figure 4:
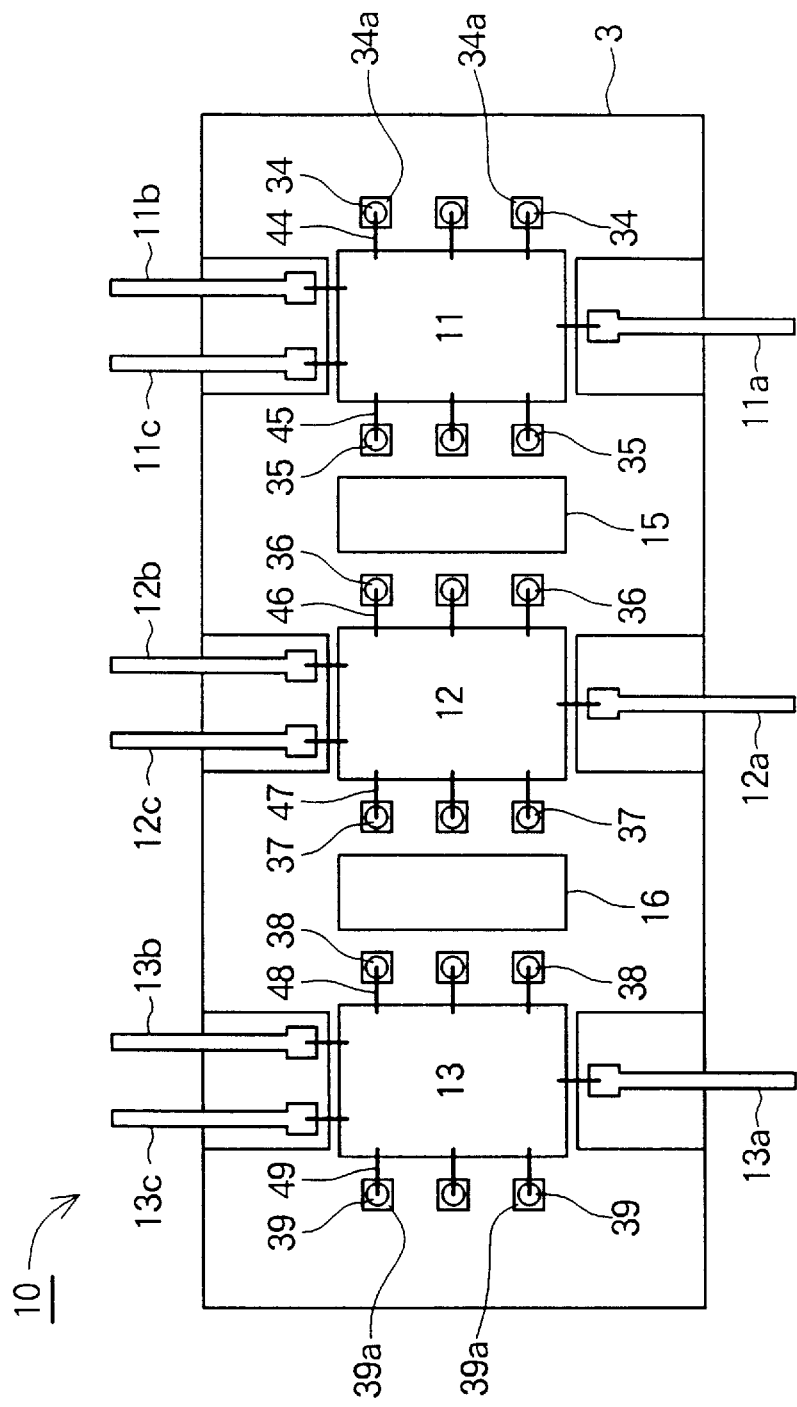
FIG. 4 is a schematic plan view of the microwave circuit package of FIG. 3, with its frame and upper lid removed.

FIGS. 3 and 4 show a microwave circuit package 10 according to a second embodiment the present invention, which is characterized by the provision of three MMICs. Like the above-described first embodiment, this package 10 includes a base plate 3 made of a metal material, such as kovar, on which are mounted three MMICs 11, 12 and 13. The package 10 also includes a frame 5 fixedly mounted on the base plate 3 and an upper lid 6 secured to the top surface of the frame 5, so as to seal the three MMICs 11, 12 and 13 within the package 10. A spacer 15 made of a dielectric material is mounted on the base plate 3 to separate the MMICs 11 and 12 from each other, and another spacer 16 made of a dielectric material is also mounted on the base plate 3 to separate the MMICs 12 and 13 from each other.

As seen from FIGS. 3 and 4, three pairs of biasing DC terminals 34 and 35 for supplying predetermined biasing voltage extend through the metallic base plate 3 with respective insulators 34a and 35a interposed therebetween and are connected via bonding wires 44 and 45 to a power supply terminal of the first MMIC 11. Three pairs of biasing DC terminals 36 and 37 for supplying predetermined biasing voltage extend through the metallic base plate 3 with respective insulators 36a and 37a interposed therebetween and are connected via bonding wires 46 and 47 to a power supply terminal of the second MMIC 12. Similarly, three pairs of biasing DC terminals 38 and 39 for supplying predetermined biasing voltage extend through the metallic base plate 3 with respective insulators 38a and 39a interposed therebetween and are connected via bonding wires 48 and 49 to a power supply terminal of the third MMIC 13.

According to the second embodiment, the volume of the interior space of the microwave circuit package 10 is even further reduced by the provision of the two spacers separating the MMICs 11, 12 and 13 from each other. In the illustrated example, the MMICs 11 and 12 and DC terminals 34, 35 and 36, 37 are provided substantially symmetrically about the spacer 15, and the MMICs 12 and 13 and DC terminals 36, 37 and 38, 39 are provided substantially symmetrically about the spacer 16.

As shown in FIG. 4, the first MMIC 11 has a high-frequency input connected via a bonding wire to a RF terminal 11a and two high-frequency outputs connected via bonding wires to RF terminals 11b and 11c. The second MMIC 12 has a high-frequency input connected via a bonding wire to a RF terminal 12a and two high-frequency outputs connected via bonding wires to RF terminals 12b and 12c. Similarly, the third MMIC 13 has a high-frequency input connected via a bonding wire to a RF terminal 13a and two high-frequency outputs connected via bonding wires to RF terminals 13b and 13c.

The DC terminals 34 to 39 each extend perpendicularly to the general plane of the metallic base plate 3 as best seen in FIG. 3, and the RF terminals 11a–11c, 12a–12c, 13a–13c are provided on opposite sides (upper and lower sides in the example of FIG. 4) and extend along the surface of the metallic base plate 3. This achieves adjoining and high-density arrangement of the various components of the microwave circuit package 10.

Figure 5:
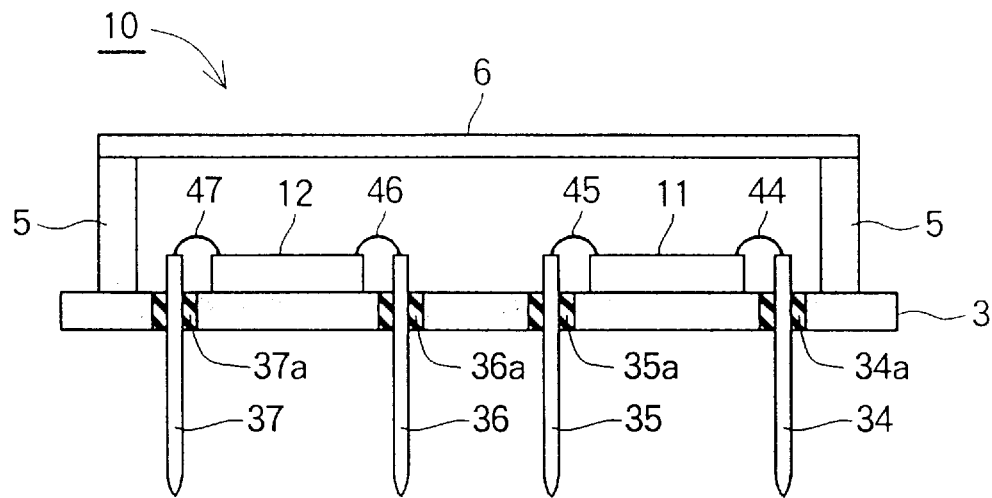
FIG. 5 is a schematic sectional view of a microwave circuit package according to a third embodiment of the present invention.
Figure 6:
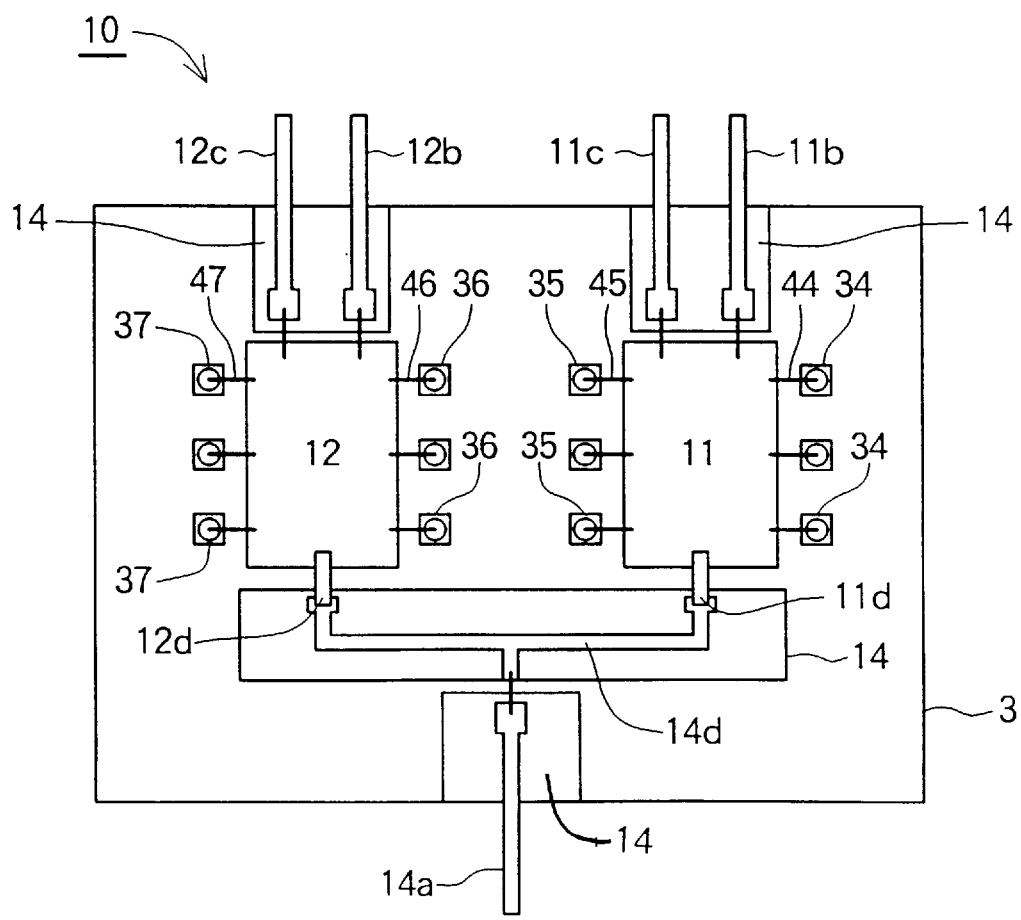
FIG. 6 is a schematic plan view of the microwave circuit package of FIG. 5, with its frame and upper lid removed.

FIGS. 5 and 6 show a microwave circuit package 10 according to a third embodiment of the present invention. As in the first embodiment, this microwave circuit package 10 includes a base plate 3 made of a metal material, such as kovar, on which are mounted two MMICs 11 and 12. The package 10 also includes a frame 5 fixedly mounted on the base plate 3 and an upper lid 6 secured to the top surface of the frame 5, so as to seal the MMICs 11 and 12 within the package 10.

As seen in FIG. 6, a dielectric substrate 14 made of a ceramic material or the like is also mounted on the metallic base plate 3 and has substantially the same height as substrates or chips of the MMICs 11 and 12. A strip conductor 14d is provided on the dielectric substrate 14, so that the strip conductor 14d, dielectric substrate 14 and metallic base plate 3 together form a microstrip line. For example, the strip conductor 14d may have a width of 0.48 mm and a height of 0.006 mm, and the dielectric substrate 14 may have a height of 0.51 mm. The dielectric substrate 14 may be made of alumina ceramic.

As shown in FIGS. 5 and 6, three pairs of biasing DC terminals 34 and 35 for supplying predetermined biasing voltage extend through the metallic base plate 3 with respective insulators 34a and 35a interposed therebetween and are connected via bonding wires 44 and 45 to a power supply terminal of the first MMIC 11. Similarly, three pairs of biasing DC terminals 36 and 37 for supplying predetermined biasing voltage extend through the metallic base plate 3 with respective insulators 36a and 37a interposed therebetween and are connected via bonding wires 46 and 47 to a power supply terminal of the second MMIC 12.

According to the third embodiment, the volume of the interior space of the microwave circuit package 10 is reduced by the provision of the dielectric substrate 14 having substantially the same height as the substrates of the MMICs 11 and 12. The MMICs 11 and 12 are connected with the microstrip line via beam leads 11d and 12d, respectively. More specifically, the first MMIC 11 has a high-frequency input connected via the beam lead lid with the strip conductor 14d on the dielectric substrate 14, while the second MMIC 12a has a high-frequency input connected via the beam lead 12d with the strip conductor 14d.

The first MMIC 11 also has two high-frequency outputs connected via respective bonding wires to RF terminals 11b and 11c, while the second MMIC 12 also has two high-frequency outputs connected via respective bonding wires to RF terminals 12b and 12c.

The strip conductor 14d on the dielectric substrate 14 is connected via a bonding wire to a RF terminal 14a. The strip conductor 14d forms a circuit element; for example, this conductor 14d forms a distributor for distributing high-frequency signals, in order to reduce the necessary number of the RF terminals.

In the third embodiment, the DC terminals 34 to 37 each extend perpendicularly to the general plane of the metallic base plate 3 as best seen in FIG. 5, and the RF terminals 11b, 11c, 12b, 12c and the RF terminal 14a are provided on opposite sides (upper and lower sides in the example of FIG. 6) and extend along the surface of the metallic base plate 3. This achieves adjoining and high-density arrangement of the various components of the microwave circuit package 10.

Figure 7:
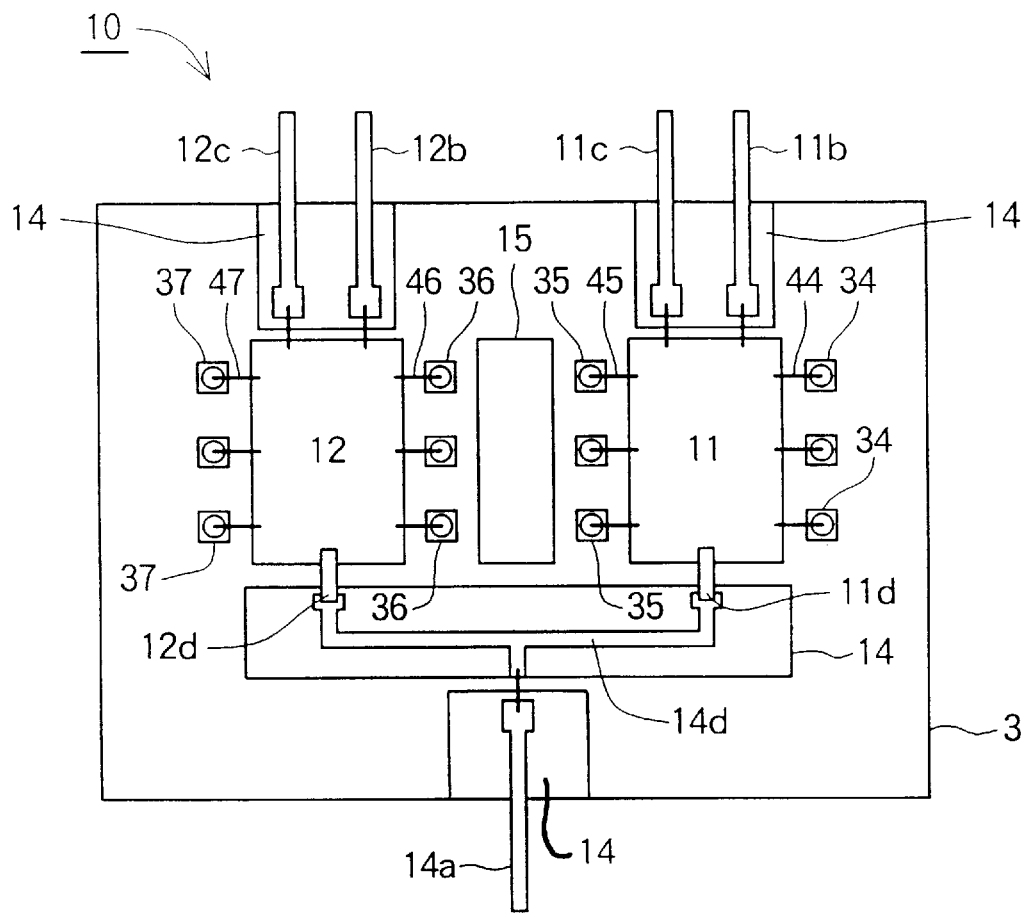
FIG. 7 is a schematic plan view of the microwave circuit package according to a fourth embodiment of the present invention, with its frame and upper lid removed.

FIG. 7 shows a microwave circuit package 10 according to a fourth embodiment of the present invention, which corresponds to a combination of the above-described first and third embodiments. Namely, this microwave circuit package 10 includes two MMICs 11 and 12 mounted on a base plate 3 made of a metal material. On the metallic base plate 3, there are also mounted a spacer 15, made of a dielectric material, for separating the MMICs 11 and 12 from each other, and a dielectric substrate 14 having substantially the same height as the substrates (chips) of the MMICs 11 and 12. These components are sealed in a space defined by the metallic base plate 3, frame and upper lid (illustration of the frame and upper lid is omitted in FIG. 7). A strip conductor 14d is provided on the dielectric substrate 14, so that the strip conductor 14d, dielectric substrate 14 and metallic base plate 3 together form a microstrip line.

As further shown in FIG. 7, three pairs of biasing DC terminals 34 and 35 for supplying predetermined biasing voltage extend through the metallic base plate 3 with respective insulators interposed therebetween and are connected via bonding wires 44 and 45 to a power supply terminal of the first MMIC 11. Similarly, three pairs of biasing DC terminals 36 and 37 for supplying predetermined biasing voltage extend through the metallic base plate 3 with respective insulators interposed therebetween and are connected via bonding wires 46 and 47 to a power supply terminal of the second MMIC 12.

According to the fourth embodiment, the volume of the interior space of the microwave circuit package 10 is even further reduced by the provision of the spacer 15 separating the MMICs 11 and 12 from each other and the dielectric substrate 14 having substantially the same height as the substrates of the MMICs 11 and 12. The MMICs 11 and 12 are connected with the microstrip line via beam leads 11d and 12d, respectively. More specifically, the first MMIC 11 has a high-frequency input connected via the beam lead lid with the strip conductor 14d on the dielectric substrate 14, while the second MMIC 12a has a high-frequency input connected via the beam lead 12d with the strip conductor 14d.

The first MMIC 11 also has two high-frequency outputs connected via respective bonding wires to RF terminals 11b and 11c, while the second MMIC 12 also has two high-frequency outputs connected via respective bonding wires to RF terminals 12b and 12c. The strip conductor 14d on the dielectric substrate 14 is connected via a bonding wire to a RF terminal 14a. The strip conductor 14d forms a circuit element; for example, this conductor 14d forms a distributor for distributing high-frequency signals, in order to reduce the necessary number of the RF terminals. Further, the DC terminals 34 to 37 each extend perpendicularly to the general plane of the metallic base plate 3 (see FIG. 1), and the RF terminals 11b, 11c, 12b, 12c and the RF terminal 14a are provided on opposite sides (upper and lower sides in the example of FIG. 7) and extend along the surface of the metallic base plate 3. This achieves adjoining and high-density arrangement of the various components of the microwave circuit package 10.

Figure 8:
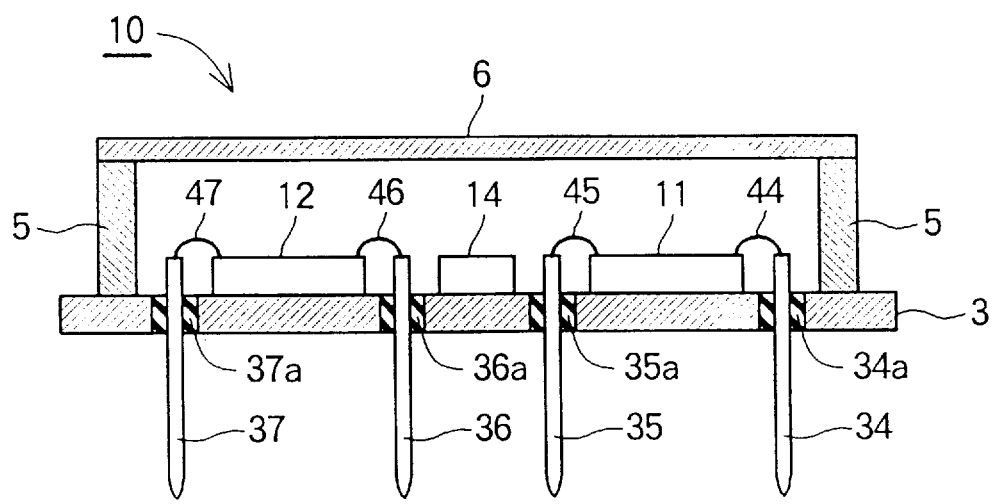
FIG. 8 is a schematic sectional view of a microwave circuit package according to a fifth embodiment of the present invention.
Figure 9:
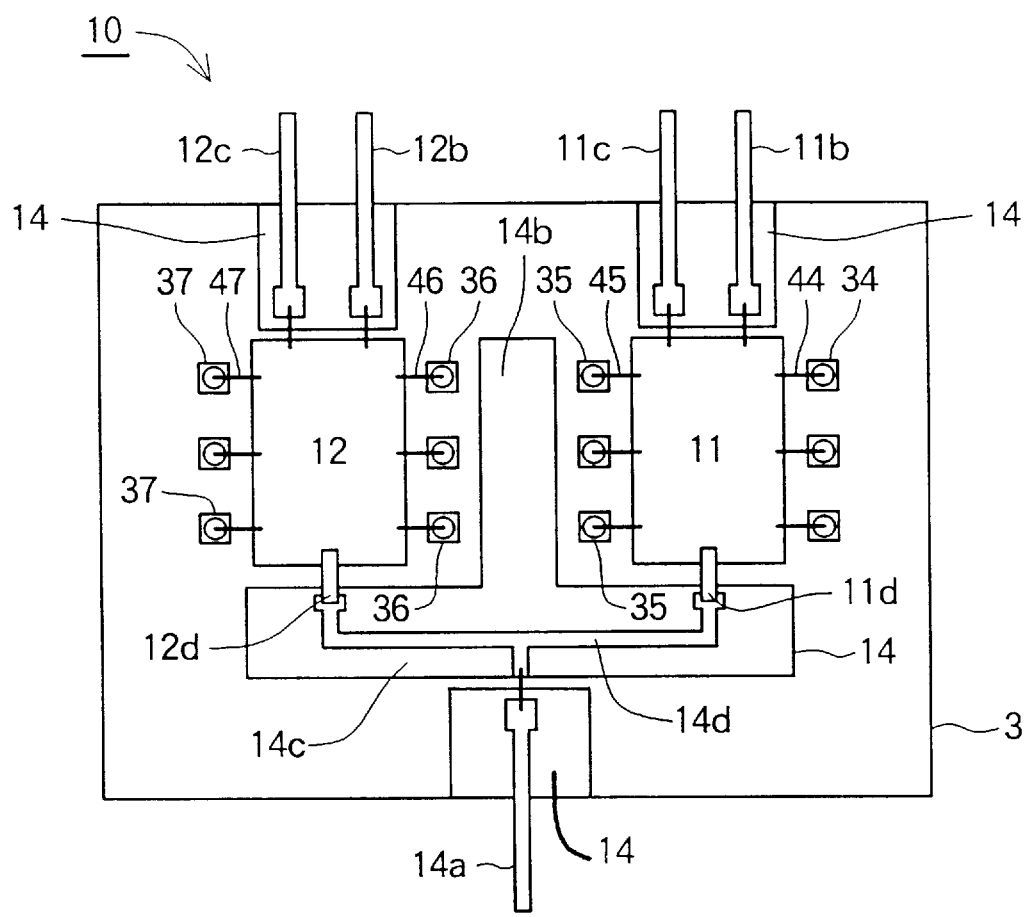
FIG. 9 is a schematic plan view of the microwave circuit package of FIG. 8, with its frame and upper lid removed.

FIGS. 8 and 9 show a microwave circuit package 10 according to a fifth embodiment of the present invention, which is characterized in that a spacer and dielectric substrate are integrally formed. Namely, this microwave circuit package 10 includes substrates (chips) of two MMICs 11 and 12 mounted on a base plate 3 made of a metal material. On the metallic base plate 3, there is also mounted a T-shaped dielectric substrate 14 which includes a step portion 14b that has generally the same height as the MMIC substrates so as to separate the MMICs 11 and 12 from each other and a flange portion 14c extending along one end of each of the MMICs 11 and 12. These components are sealed in a space defined by the metallic base plate 3, frame 5 and upper lid 6. A strip conductor 14d is provided on the dielectric substrate 14, so that the strip conductor 14d, dielectric substrate 14 and metallic base plate 3 together form a microstrip line.

As further shown in FIG. 9, three pairs of biasing DC terminals 34 and 35 for supplying predetermined biasing voltage extend through the metallic base plate 3 with respective insulators 34a and 35a interposed therebetween and are connected via bonding wires 44 and 45 to a power supply terminal of the first MMIC 11. Similarly, three pairs of biasing DC terminals 36 and 37 for supplying predetermined biasing voltage extend through the metallic base plate 3 with respective insulators 36a and 37a interposed therebetween and are connected via bonding wires 46 and 47 to a power supply terminal of the second MMIC 12.

According to the fifth embodiment, the volume of the interior space of the microwave circuit package 10 is even further reduced by the provision of the T-shaped dielectric substrate 14 having substantially the same height as the substrates of the MMICs 11 and 12. The MMICs 11 and 12 and DC terminals 34, 35 and 36, 37 are provided in substantial symmetry about the T-shaped dielectric substrate 14.

The MMICs 11 and 12 are connected with the microstrip line via beam leads 11d and 12d, respectively. More specifically, the first MMIC 11 has a high-frequency input connected via the beam lead 11d with the strip conductor 14d on the dielectric substrate 14, while the second MMIC 12 has a high-frequency input connected via the beam lead 12d with the strip conductor 14d.

The first MMIC 11 also has two high-frequency outputs connected via respective bonding wires to RF terminals 11b and 11c, while the second MMIC 12 also has two high-frequency outputs connected via respective bonding wires to RF terminals 12b and 12c. The strip conductor 14d on the dielectric substrate 14 is connected via a bonding wire to a RF terminal 14a. The strip conductor 14d forms a circuit element; for example, this conductor 14d forms a distributor for distributing high-frequency signals, in order to reduce the necessary number of the RF terminals. Further, the DC terminals 34 to 37 each extend perpendicularly to the general plane of the metallic base plate 3 (see FIG. 8), and the RF terminals 11b, 11c, 12b, 12c and the RF terminal 14a are provided on opposite sides (upper and lower sides in the example of FIG. 9) and extend along the surface of the metallic base plate 3. This achieves adjoining and high-density arrangement of the various components of the microwave circuit package 10.

While several illustrative embodiments of the invention have been shown and described, numerous variations and alternative embodiments, such as the following, may occur to those skilled in the art, without departing from the spirit and scope of the invention.

In the above-described embodiments, the strip conductor 14d on the dielectric substrate 14 (strip conductor of the microstrip line) and RF terminal 14a may be interconnected via a beam lead or ribbon made of gold or the like. Further, in the first and second embodiments shown in FIGS. 1 to 4, the high-frequency inputs of the MMICs 11, 12, 13 and corresponding RF terminals 11a, 12a, 13a may be interconnected via beam leads or ribbons made of gold or the like. Similarly, the high-frequency outputs of the MMICs 11, 12, 13 and corresponding RF terminals 11b, 11c, 12b, 12c, 13b, 13c may be interconnected via beam leads or ribbons made of gold or the like. In the embodiments shown in FIGS. 5 to 9, the beam leads 11d and 12d may be replaced by ribbons.

Furthermore, in the above-described embodiments, a dielectric material may be interposed between each of the RP terminals and the metallic base plate 3, and each of the RF terminals and the metallic base plate 3 may be interconnected via a beam lead or ribbon made of gold or the like rather than via the bonding wire. The height of the upper lid made of a dielectric material may be reduced to downsize the microwave circuit package.

Furthermore, in the above-described embodiments, the spacer 15 may be made of the same material as the package frame 5. In a case where a metallic film is formed on the inner surface of the package frame 5, a metallic film may be formed on the top or side surface of the spacer 15. The RF terminals 11a–11c, 12a–12c, 13a–13c and 14a may be provided to extend perpendicularly to the general plane of the metallic base plate 3, similarly to the DC terminals 34 to 39. The bonding portions for the RF terminals may be reduced in width depending on an intended application.

The above-described various embodiments of the microwave circuit package may be applied to the radar module and antenna apparatus which is proposed, by the assignee of the present application, in copending Japanese Patent Application No. HEI-7-239311. In such a case, a plurality of MMICs, each including four high-frequency FETs and two mixers, are mounted within the package so as to provide multichip circuitry.

Figure 10A:
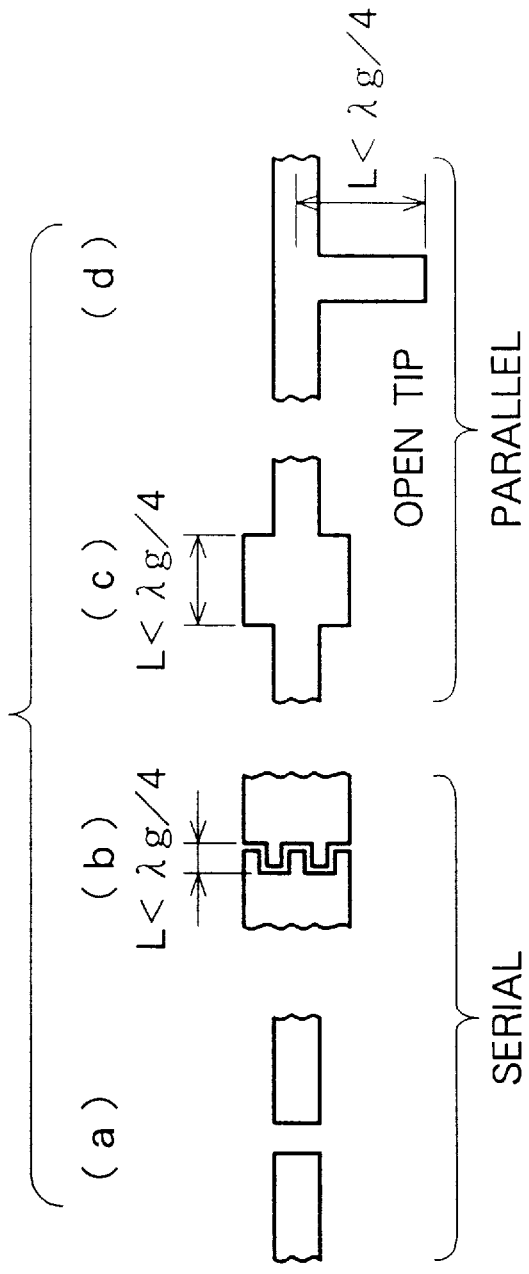
Figure 10B:
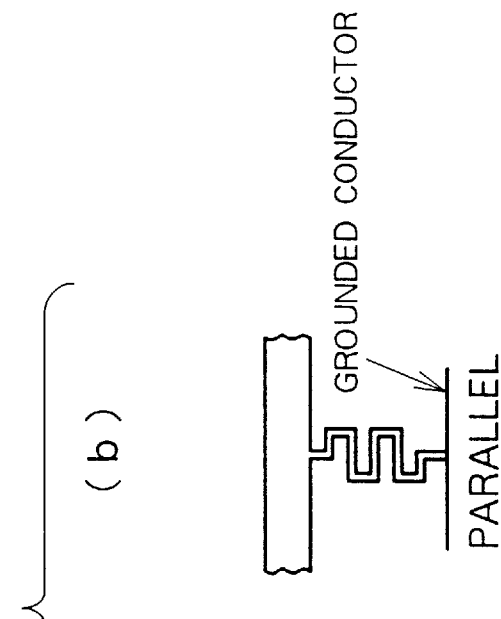
Figure 10B:
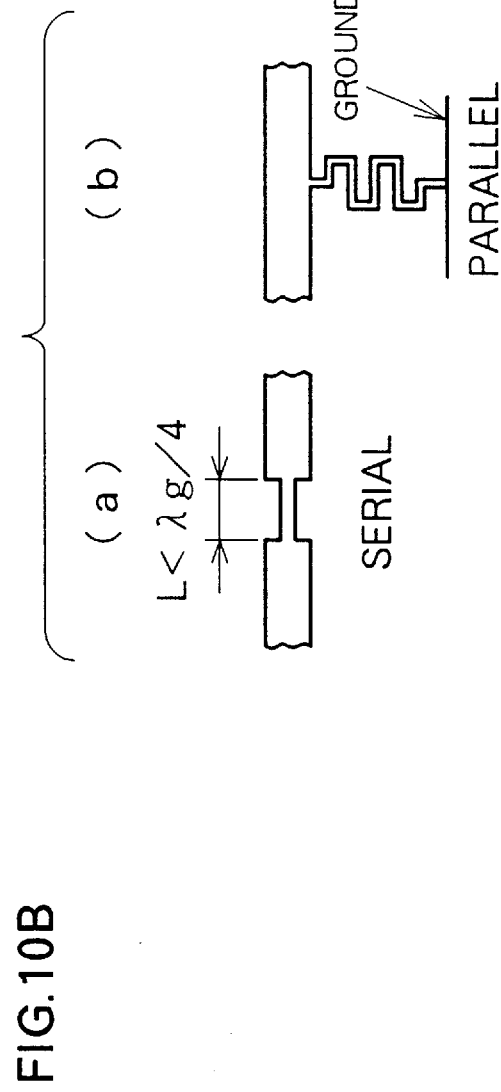
Figure 11:
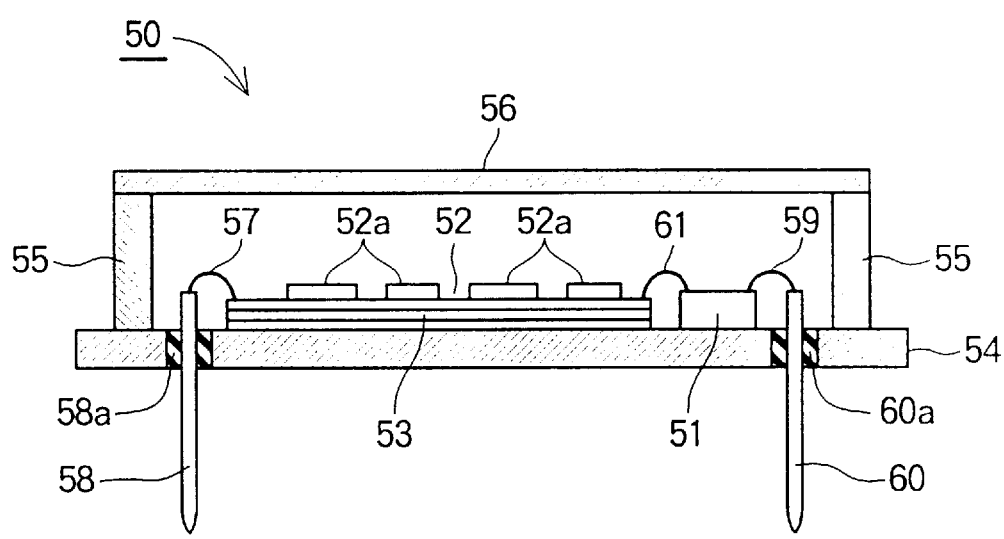
FIG. 11 is a schematic sectional view of a conventionally-known microwave circuit package.

In a case where the strip conductor 14d on the dielectric substrate 14 is used to form a circuit element, the width of the strip conductor 14d may be partly increased or reduced so as to provide a distributed parameter circuit element. FIGS. 10A and 10B show various examples of circuit elements formed of microstrip lines (strip conductors), of which FIG. 10A shows capacitance circuit elements and FIG. 10B shows inductance circuit elements. More specifically, in FIG. 10A, (a) and (b) denote series-type circuit elements, while (c) and (d) denote parallel-type circuit elements having one or more rectangular protrusions formed by partly expanding the width of the strip conductors. In FIG. 11, (a) denotes a series-type circuit element, while (b) denotes a parallel-type circuit element formed to have a spiral shape.

The above-described embodiments accomplish various benefits as set forth below.

Namely, in the above-described microwave circuit package according to the present invention, a plurality of the MMICs and the spacer for separating the MMICs from each other are mounted together on a single metallic base plate and sealed in the package. By the provision of such a spacer separating the MMICs from each other, the volume of the interior space of the package can be optimized to effectively prevent abnormal resonance, electromagnetic waves of unnecessary frequencies, etc. Particularly, by positioning the MMICs symmetrically about the spacer, the MMICs can be packaged with the same resonance system. As a result, it is possible to effectively prevent abnormal resonance, electromagnetic waves of unnecessary frequencies, etc., and the MMICs can operate with the same characteristics, which achieves increased reliability of the microwave circuit.

Further, the dielectric substrate having substantially the same height as substrates of the MMICs is mounted on the metallic base plate, and the MMICs and dielectric substrate are sealed in the package. This arrangement can also effectively reduce the volume of the interior space of the package and prevent abnormal resonance, electromagnetic waves of unnecessary frequencies, etc.

Furthermore, because the strip conductor is provided on the dielectric substrate so as to form a microstrip line thereon and the strip conductor and the circuit surface of the MMICs are positioned in substantially the same plane, the wiring on the strip conductor and MMICs is positioned in substantially the same plane and hence can be made shorter. Consequently, abnormal resonance and electromagnetic waves of unnecessary frequencies can be more effectively prevented than where the strip conductor and the circuit surface of the MMICs are not at the same height. This arrangement also achieves increased reliability of the microwave circuit. The microstrip line can supply high-frequency signals to the MMICs in a stable condition with less transmission loss.

Moreover, by separating the MMICs from each other via the dielectric substrate in such a way that the MMICs are positioned symmetrically about the dielectric substrate, the MMICs can be packaged with the same resonance system. As a result, it is possible to effectively prevent abnormal resonance, electromagnetic waves of unnecessary frequencies, etc.

Further, with the arrangement that a circuit element such as a capacitance or inductance circuit is formed by the microstrip line, the height and area of the circuit element can be reduced to a considerable degree. Thus, such a circuit element that was heretofore difficult to form within a MMIC in a small size can be easily packaged together with the MMICs.

Furthermore, by the strip conductor forming a circuit element on the dielectric substrate at generally the same height as the substrates of the MMICs, the circuit element and the circuit surface of the MMICs can be positioned in substantially the same plane and the wiring on the circuit element and MMICs is positioned in substantially the same plane.

Additionally, with the arrangement that the microstrip line and MMICs are interconnected via beam leads, the microstrip line and MMICs can be interconnected with increased strength and with less inductance, which achieves enhanced operational characteristics of the microwave circuit in high-frequency ranges. This arrangement also permits increased rigidity of the package against vibration, to thereby achieve increased reliability of the microwave circuit. Also, because the dielectric substrate with the strip conductor formed thereon and the substrates of the MMICs are positioned at generally the same height, the interconnection via the beam leads is greatly facilitated.

Moreover, with the arrangement that the spacer is greater in height than the MMICs and is made of a same material as the package frame, the spacer affords the same effects as if the MMICs were separated from each other by the frame.

What is claimed is:

1. A microwave circuit package comprising:

a single metallic base plate on which are mounted a plurality of monolithic microwave integrated circuits; and at least one spacer mounted on said metallic base plate so as to separate said monolithic microwave integrated circuits from each other, said spacer being made of a dielectric material, wherein said monolithic microwave integrated circuits and spacer are sealed in said package.

2. A microwave circuit package comprising:

a single metallic base plate on which are mounted a plurality of monolithic microwave integrated circuits;

a dielectric substrate mounted on said metallic base plate and having substantially the same height as substrates of said monolithic microwave integrated circuits; and a strip conductor provided on said dielectric substrate so as to form a microstrip line thereon, wherein said monolithic microwave integrated circuits and dielectric substrate are sealed in said package.

3. A microwave circuit package as claimed in claim 2 wherein said microstrip line forms a circuit element.

4. A microwave circuit package as claimed in claim 2 wherein said microstrip line and monolithic microwave integrated circuits are interconnected via beam leads.

5. A microwave circuit package comprising:

a single metallic base plate on which are mounted a plurality of monolithic microwave integrated circuits;

at least one spacer mounted on said metallic base plate so as to separate said monolithic microwave integrated circuits from each other, said spacer being made of a dielectric material;

a dielectric substrate mounted on said metallic base plate and having substantially the same height as substrates of said monolithic microwave integrated circuits; and a strip conductor provided on said dielectric substrate so as to form a microstrip line thereon, wherein said monolithic microwave integrated circuits, spacer and dielectric substrate are sealed in said package.

6. A microwave circuit package as claimed in claim 5 wherein said microstrip line forms a circuit element.

7. A microwave circuit package as claimed in claim 5 wherein said microstrip line and monolithic microwave integrated circuits are interconnected via beam leads.

8. A microwave circuit package comprising:

a single metallic base plate on which are mounted a plurality of monolithic microwave integrated circuits;

a dielectric substrate mounted on said metallic base plate so as to separate said monolithic microwave integrated circuits from each other, said dielectric substrate having substantially the same height as substrates of said monolithic microwave integrated circuits; and a strip conductor provided on said dielectric substrate so as to form a microstrip line thereon, wherein said monolithic microwave integrated circuits and dielectric substrate are sealed in said package.

9. A microwave circuit package as claimed in claim 8 wherein said microstrip line forms a circuit element.

10. A microwave circuit package as claimed in claim 8 wherein said microstrip line and monolithic microwave integrated circuits are interconnected via beam leads.

11. A microwave circuit package comprising:

a metallic base plate on which are mounted a plurality of monolithic microwave integrated circuits; and at least one spacer mounted on said metallic base plate so as to separate said monolithic microwave integrated circuits from each other, said spacer being made of a dielectric material, wherein said monolithic microwave integrated circuits, and spacer are sealed in said package, and further comprising a frame mounted on a periphery of said metallic base plate and an upper lid mounted on a top of said frame so that said monolithic microwave integrated circuits and spacer are sealed in said package by said frame and upper lid, and wherein said spacer is greater in height than substrates of said monolithic microwave integrated circuits and is made of a same material as said frame.

12. A microwave circuit package comprising:

a metallic base plate on which are mounted a plurality of monolithic microwave integrated circuits;

a dielectric substrate mounted on said metallic base plate so as to separate said monolithic microwave integrated circuits from each other, said dielectric substrate having substantially the same height as substrates of said monolithic microwave integrated circuits; and a strip conductor provided on said dielectric substrate so as to form a microstrip line thereon, wherein said monolithic microwave integrated circuits, and dielectric substrate are sealed in said package, and said dielectric substrate is a T-shaped substrate having a stem portion separating said monolithic microwave integrated circuits from each other and a flange portion located along one end of each said integrated circuit.

* * * * *